US008400141B2

(12) United States Patent
Wernet et al.

(10) Patent No.: US 8,400,141 B2
(45) Date of Patent: Mar. 19, 2013

(54) APPARATUS FOR DETERMINING AND/OR MONITORING A PROCESS VARIABLE

(75) Inventors: Armin Wernet, Rheinfelden (DE); Roland Dieterle, Lörrach (DE); Axel Humpert, Rheinau (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 559 days.

(21) Appl. No.: 12/448,131

(22) PCT Filed: Nov. 30, 2007

(86) PCT No.: PCT/EP2007/063064
§ 371 (c)(1),
(2), (4) Date: Dec. 8, 2009

(87) PCT Pub. No.: WO2008/071562
PCT Pub. Date: Jun. 19, 2008

(65) Prior Publication Data
US 2010/0109649 A1    May 6, 2010

(30) Foreign Application Priority Data
Dec. 12, 2006  (DE) .......... 10 2006 058 925

(51) Int. Cl.
*G01R 1/20*    (2006.01)

(52) U.S. Cl. .................. 324/126; 324/76.77; 324/76.11
(58) Field of Classification Search .................... None
See application file for complete search history.

(56) References Cited

U.S. PATENT DOCUMENTS

| 6,512,358 | B2 * | 1/2003 | Klofer et al. ............. 324/103 P |
| 6,956,343 | B2 | 10/2005 | Berroth |
| 2002/0064011 | A1 * | 5/2002 | Loechner .................. 361/92 |
| 2004/0027085 | A1 | 2/2004 | Berroth |

FOREIGN PATENT DOCUMENTS

| DE | 101 61 992 A2 | 7/2002 |
| EP | 1 202 139 A1 | 5/2002 |
| EP | 1 350 293 | 10/2003 |
| WO | WO 02/054567 A2 | 7/2002 |

* cited by examiner

*Primary Examiner* — Melissa Koval
*Assistant Examiner* — Trung Nguyen
(74) *Attorney, Agent, or Firm* — Bacon & Thomas, PLLC

(57) ABSTRACT

An apparatus for determining and/or monitoring at least one process variable. The apparatus includes: at least one energy input, via which the apparatus receives energy for operation of the apparatus. The invention includes features that: at least one measuring unit is provided, which measures energy applied to the energy input; and at least one control unit is provided, which, based on comparison of the measured energy with a desired value of the energy requirement, controls at least one unit of the apparatus.

8 Claims, 1 Drawing Sheet

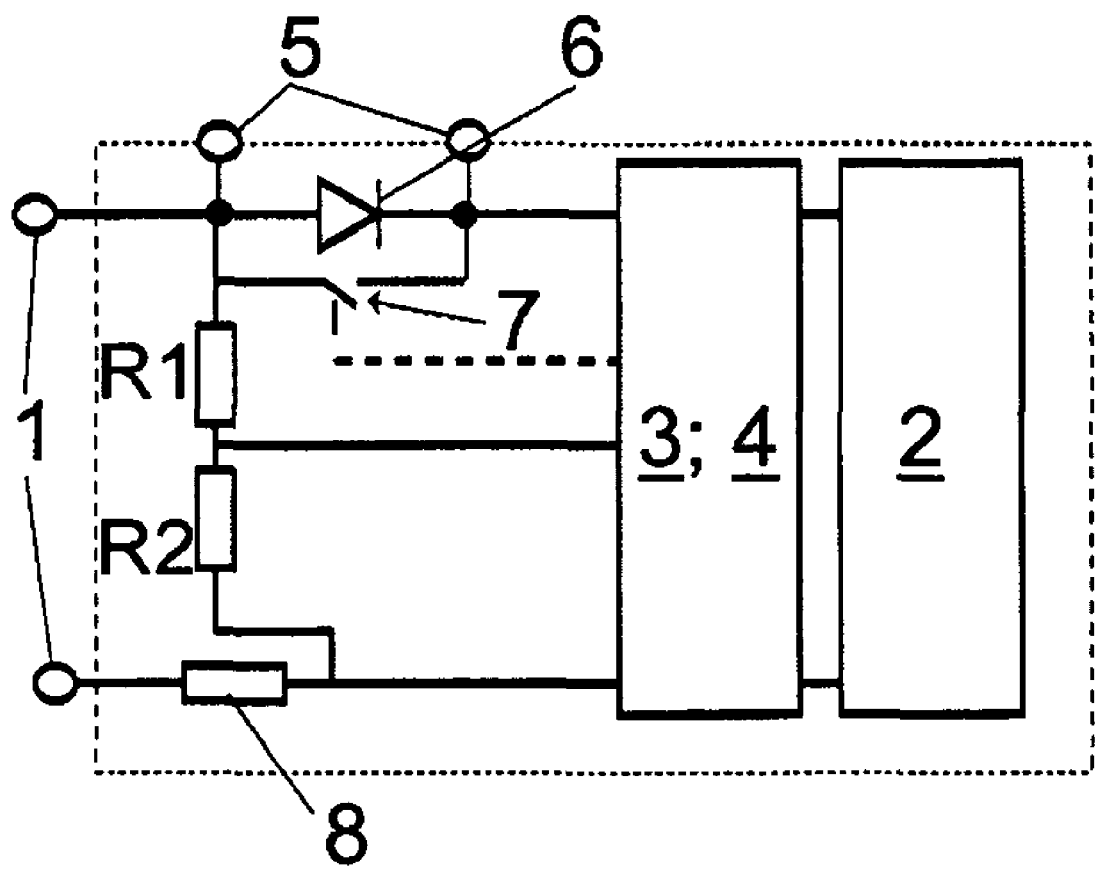

APPARATUS FOR DETERMINING AND/OR MONITORING A PROCESS VARIABLE

TECHNICAL FIELD

The invention relates to an apparatus for determining and/or monitoring at least one process variable. The apparatus includes at least one energy input, via which the apparatus receives energy for operation of the apparatus. The process variable is, for example, fill level, density, viscosity, pressure, pH-value or electrical conductivity of a medium, which is, for example, a liquid or a bulk good.

BACKGROUND DISCUSSION

Measuring devices of process and automation technology most often include: at least one probe unit, which, based on the process variable or a change of the process variable, produce a measured variable; and an end stage. The end stage produces a suitable output signal as a function of the measured variable, or the process variable, or a change of the two variables. In the case of many electrical current controlled, end stages, which produce e.g. a 4 . . . 20 mA signal, the function of an interlock diode is offered. Therewith, operating personnel, or customers, can measure directly at the measuring device, with an ordinary multimeter, the actual value of the electrical current output; i.e. the measured value can be tapped directly on-site. A disadvantage of such an arrangement is that, when the interlock diode is not shunted by a multimeter measuring device, i.e. no measuring is being performed, the interlock diode is switched into the 4 . . . 20 mA, electrical current path. There is, then, always a certain voltage drop, e.g. 0.7 V, across the diode. The circuit parts connected downstream lack this voltage in their supply. This leads, in the case of devices operated with low terminal voltage, often to problems, since the measuring devices must function just with the remaining voltage (e.g. 9.3 V instead of a 10 V terminal voltage).

SUMMARY OF THE INVENTION

An object of the invention is, thus, to provide a measuring device, which can function even in the case of small available energy.

The invention achieves the object by features including that: at least one measuring unit is provided, which measures the energy applied to the energy input; and at least one control unit is provided, which, based on a comparison of the measured energy with a desired value of the energy requirement, controls at least one unit of the apparatus.

An embodiment provides, that the measuring unit measures the voltage applied to the energy input.

An embodiment includes, that the control unit compares the measured voltage value with a desired voltage.

An embodiment provides, that at least one signal producing unit is provided, which produces at least one electrical current signal.

An embodiment includes, that the electrical current signal is set corresponding to the process variable and/or a change of the process variable.

An embodiment provides, that at least one test socket is provided, via which the electrical current signal is tappable.

An embodiment includes, that at least one interlock diode is provided, which is connected electrically with the test socket.

An embodiment provides, that at least one switch is provided, via which the test socket can be switched in and/or out.

An embodiment includes, that at least one switch is provided, via which a voltage drop across the test socket and/or across the interlock diode is changeable.

An embodiment provides, that the switch and the interlock diode are embodied and matched to one another in such a manner, that the switch shunts the interlock diode in at least one switch state.

An embodiment includes, that the control unit and the switch are embodied and matched to one another in such a manner, that the control unit operates the switch. The control unit, thus, opens, or closes, the switch, and acts, therewith, also on the interlock diode.

In an embodiment of the invention, thus, a compromise is reached between interlock diode functionality and minimizing the terminal voltage. If the supply voltage is too small, then the interlock diode is switched out, and, therewith, the opportunity to tap the signal is lost.

By way of example, a measuring device has a terminal voltage range specified between 10 V and 30V. Because of the interlock diode in the electrical current path, there remains for the rest of the measuring device only 9 V to 29 V. When the voltage reaches down to 9V, then the situation becomes problematic, because then the downstream circuit has too little voltage, or because then the energy used by the interlock diode (1 V*20 mA=20 mW) should be saved, so, according to the invention, the interlock diode is then shunted.

BRIEF DESCRIPTION OF THE DRAWINGS

The invention will now be explained in greater detail on the basis of the appended drawing, the sole FIGURE of which shows as follows:

FIG. 1 a schematic drawing of a part of a measuring device of the invention.

DETAILED DISCUSSION IN CONJUNCTION WITH THE DRAWINGS

FIG. 1 shows the part of a measuring device essential for a description of the invention. Thus, for example, the section with the sensor equipment is not presented. The signal producing unit 4 produces an output signal based on the measurement signal for the process variable. In such case, for example, of concern is a 4 . . . 20 mA signal. This signal is sent via a corresponding data line, for example, to a superordinated control room.

On site, test socket 5 permits direct tapping of the signal. In this regard, an electrical current measuring device/multimeter is switched to the two contacts of the test socket 5 arranged before and after the interlock diode 6. The low ohm resistor of the multimeter causes, even at maximum electrical current, a voltage, which, in any case, lies under the electrical current flow voltage of the interlock diode 6. Thus, the electrical current flows via the multimeter and is directly registered.

The measuring device is supplied via the energy input 1 with electrical power, e.g. via the applying of a voltage.

According to the invention, the energy applied (in this embodiment, the applied voltage) is measured by a measuring unit 2, here in connection with the two electrical resistors R1 and R2. Proceeding from a comparison of the measured voltage value with a desired value, in this example, the control unit 3 controls the functioning of the test socket 5, by suitably shunting, or not shunting, the interlock diode 6 via a switch 7. If the interlock diode 6 is shunted, then there is no voltage drop across it. Simultaneously, however, test socket 5 is no longer functional.

Measuring unit 2, control unit 3 and signal producing unit 4 each has, for example, its own microcontroller. Their functionalities can, however, also be implemented in a single, shared microcontroller.

The invention claimed is:

1. An apparatus for determining and/or monitoring at least one process variable, comprising:
   at least one energy input, via which the apparatus receives energy for operation of the apparatus;
   at least one measuring unit, which measures energy applied to said at least one energy input;
   at least one control unit, which, based on a comparison of measured energy with a desired value of the energy requirement, controls said at least one measuring unit of the apparatus;
   at least one signal producing unit, which produces at least one electrical current signal;
   at least one test socket, via which the electrical current signal is tappable;
   at least one interlock diode, which is connected electrically with said at least one test socket; and
   at least one switch, via which said at least one test socket can be switched in or out or via which a voltage drop across said at least one test socket and/or across said at least one interlock diode is changeable, wherein:
   said at least one switch and said at least one interlock diode are embodied and matched to one another in such a manner, that said at least one switch shunts said at least one interlock diode in at least one switch state.

2. The apparatus as claimed in claim 1, wherein:
   said at least one measuring unit measures electrical voltage applied to said at least one energy input.

3. The apparatus as claimed in claim 2, wherein:
   said at least one control unit compares the measured voltage value with a desired voltage.

4. The apparatus as claimed in claim 1, wherein:
   the electrical current signal corresponds to the process variable and/or to a change of the process variable.

5. An apparatus for determining and/or monitoring at least one process variable, comprising:
   at least one energy input, via which the apparatus receives energy for operation of the apparatus;
   at least one measuring unit, which measures energy applied to said at least one energy input;
   at least one control unit, which, based on a comparison of measured energy with a desired value of the energy requirement, controls said at least one measuring unit of the apparatus;
   at least one signal producing unit, which produces at least one electrical current signal;
   at least one test socket, via which the electrical current signal is tappable; and
   at least one switch, via which said at least one test socket can be switched in or out, wherein:
   said at least one control unit and said at least one switch are embodied and matched to one another in such a manner, that said at least one control unit operates said at least one switch.

6. The apparatus as claimed in claim 5, wherein:
   said at least one measuring unit measures electrical voltage applied to said at least one energy input.

7. The apparatus as claimed in claim 6, wherein:
   said at least one control unit compares the measured voltage value with a desired voltage.

8. The apparatus as claimed in claim 5, wherein:
   the electrical current signal corresponds to the process variable and/or to a change of the process variable.

* * * * *